United States Patent
Jain et al.

(10) Patent No.: US 10,897,192 B1
(45) Date of Patent: Jan. 19, 2021

(54) SCHEME TO REDUCE STATIC POWER CONSUMPTION IN ANALOG CONTROLLER BASED POWER CONVERTERS REQUIRING AN EXTERNAL HIGH VOLTAGE STARTUP CIRCUIT

(71) Applicant: STMicroelectronics International N.V., Geneva (CH)

(72) Inventors: Akshat Jain, Himachal Pradesh (IN); Saurabh Sona, Up (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/671,318

(22) Filed: Nov. 1, 2019

(51) Int. Cl.
*H02M 1/10* (2006.01)
*H02M 1/36* (2007.01)
*H03K 17/615* (2006.01)
*H02M 1/00* (2006.01)

(52) U.S. Cl.
CPC ............ *H02M 1/36* (2013.01); *H03K 17/615* (2013.01); *H02M 2001/0048* (2013.01)

(58) Field of Classification Search
CPC ............ H02M 1/36; H02M 2001/0048; H03K 17/615
USPC ........................................................ 327/540
See application file for complete search history.

(56) References Cited

U.S. PATENT DOCUMENTS

| 7,317,302 | B1* | 1/2008 | Collins | H02M 3/156 323/222 |
| 7,566,845 | B2* | 7/2009 | Usui | H02M 1/32 219/481 |
| 8,810,212 | B2* | 8/2014 | Hirose | H02M 3/1588 323/222 |
| 9,236,035 | B1* | 1/2016 | Kim | G09G 5/36 |
| 2011/0157141 | A1* | 6/2011 | Woo | H02M 3/156 345/212 |
| 2011/0279105 | A1* | 11/2011 | Hirose | H02M 3/1588 323/311 |
| 2012/0133293 | A1* | 5/2012 | Shin | H05B 45/37 315/200 R |

OTHER PUBLICATIONS

STMicroelectronics, L6562AT, Transition-mode PFC controller, Mar. 2009 (25 pages).

* cited by examiner

*Primary Examiner* — Ryan Jager
(74) *Attorney, Agent, or Firm* — Crowe & Dunlevy

(57) ABSTRACT

A Darlington switch in series with a biasing circuit is biased in an ON state by default to generate a supply voltage for a controller integrated circuit chip during start-up. On powering up, the supply voltage for the controller integrated circuit chip rises. When the supply voltage exceeds a minimum operating voltage threshold, the controller integrated circuit chip is enabled for operation and an auxiliary supply circuit begins generating the supply voltage for the controller integrated circuit chip. The Darlington switch is turned OFF when the supply voltage being generated by the auxiliary circuit is sufficiently higher than a threshold associated with the minimum operating voltage threshold. The circuit for controlling ON/OFF state of the Darlington switch has a substantially lower static power dissipation than the biasing circuit.

29 Claims, 4 Drawing Sheets

US 10,897,192 B1

SCHEME TO REDUCE STATIC POWER CONSUMPTION IN ANALOG CONTROLLER BASED POWER CONVERTERS REQUIRING AN EXTERNAL HIGH VOLTAGE STARTUP CIRCUIT

TECHNICAL FIELD

The present disclosure concerns static power consumption and, in particular, a circuit that addresses undesired static power consumption of start-up circuitry for an analog controller integrated circuit.

BACKGROUND

Reference is made to FIG. 1A which shows a basic circuit diagram for a power converter circuit 10. The circuit 10 functions to convert an input voltage at node 12 to an output voltage at node 22. Power converters, both for AC-DC conversion and DC-DC conversion, are well known in the art. It is common for such a power converter 10 to include an inductor L coupled in series with a power transistor Q1 between an input voltage node 12 and a reference voltage node 14 (such as ground). The power transistor Q1 is typically an n-channel MOSFET device having a drain coupled to an intermediate node 16 at a terminal of the inductor L and a source coupled to the reference voltage node 14. An analog controller 18 (such as a control integrated circuit chip) is configured to generate a gate drive (GD) signal that is applied to the control terminal of the power transistor Q1 to control operation of the power transistor in a switching mode. A current sensing circuit 20 is coupled to the source-drain path of the power transistor Q1 in order to sense the current flowing through the inductor L when the power transistor is turned on by the gate drive signal. The sensed current is provided to the analog controller 18. A diode D1 has an anode terminal coupled to intermediate node 16 and a cathode coupled to the output node 22. A voltage sensing circuit 24 senses the voltage at the output node 22 and provides a signal indicative of the sensed output voltage to the analog controller 18. This conversion occurs in response to the turning on/off of the power transistor Q1 as controlled by the gate drive GD signal. The on/off time of the power transistor Q1, for example driven by gate drive GD signal in pulse width modulation (PWM) mode, may be dependent on one or more of the sensed inductor current and sensed output voltage. The operation of the circuit 10 for power conversion is well known to those skilled in the art and will not be further described.

It is recognized that the analog controller 18 needs a DC supply voltage (referred to as a supply voltage VCC) in order to operate. As shown in FIG. 1B, the supply voltage VCC may be generated from the voltage at the input node 12 using a biasing circuit 30. The biasing circuit 30 may, for example, comprise a circuit network formed by one or more external bias resistors or a potential divider network (such as a resistive voltage divider circuit). This biasing scheme is not power efficient and its operation results in a significant static power loss especially when the operating voltage at the input node 12 is high (for example, in the range of several hundreds of volts). The use of such a biasing circuit 30 is quite common in scenarios where the analog controller 18 does not have an internal High Voltage (HV) startup circuit. The biasing circuit 30 is thus required in order to generate the supply voltage VCC for initially powering the analog controller chip 18 during at least the start-up phase of operation.

It is possible to generate the supply voltage VCC from another source as shown in FIG. 1C. The inductor L of FIGS. 1A-1B is replaced by the primary winding Lp of a transformer T1. The secondary winding Ls of the transformer T1 is coupled to the biasing circuit 30. When the switching of the power transistor Q1 commences during the power conversion operation, a voltage is produced by the secondary winding Ls and supplied to the biasing circuit 30 for use in generating the supply voltage VCC. Thus, the supply voltage VCC is initially generated by the biasing circuit 30 solely from the voltage at the input node 12 during start-up and is then generated by the biasing circuit 30 from at least the voltage output from the secondary winding Ls during switch mode operation. Again, this biasing scheme is not power efficient and its operation results in significant static power loss because the circuit components of the biasing circuit 30 used to generate the supply voltage VCC for the analog controller chip 18 during start-up continue to dissipate power.

Reference is now made to FIG. 2 which shows a circuit diagram for an actual implementation of the power converter circuit 10 as shown in FIG. 1C. FIG. 2 is a copy of FIG. 21 from the published data sheet (incorporated by reference) for the transition mode PFC analog controller integrated circuit chip L6562AT (March 2009) produced by STMicroelectronics which may be used as the analog controller 18. In this implementation, the power conversion being performed is power factor correction (PFC). An AC input voltage is rectified by a diode bridge circuit P1 to generate a high voltage rectified DC supply voltage (HVDC) at input node 12, wherein the HVDC follows the envelope of the AC mains input voltage. The HVDC is applied to a first terminal of a primary winding Lp of a transformer T1. A second terminal of the primary winding Lp of the transformer T1 is connected to a drain of a power transistor Q1 whose source is coupled to ground through a current sensing circuit 20. The current sensing circuit 20 includes resistors R9, R10, and R15, where R9 and R10 are connected in parallel between the source node and ground and R15 is connected between the source node and the current sensing input CS of the analog controller 18. The current sensing input CS of the analog controller integrated circuit chip is coupled to receive a current sense signal generated by the current sensing circuit 20, where the current sense signal is indicative of a magnitude of current flowing through the inductor L and power transistor Q1 when power transistor Q1 is switched on. The voltage sensing circuit 24 includes resistors R11, R12, R13 and R13B which form a resistive voltage divider generating a feedback voltage signal that is indicative of the voltage at the output node 22. The voltage sensing input INV of the analog controller integrated circuit chip is coupled to receive the feedback voltage signal. A gate of the power transistor Q1 is driven by a gate drive (GD) signal generated at a gate drive output of the analog controller 18. The second terminal of the primary winding Lp of the transformer T1 is further coupled through the diode D1 to the output node 22. When the power transistor Q1 is switched off, charge from the energy stored in the inductor L is dumped through diode D1 to the output node to charge capacitor C6.

The analog controller integrated circuit chip 18 includes a power supply input VCC that is configured to receive the supply voltage VCC generated by the biasing circuit 30. The biasing circuit 30 generating the VCC voltage includes two sub-circuits. A first sub-circuit 32 is formed by resistors R4, R5 (collectively referred to later herein as R45), with this sub-circuit 32 generating the VCC voltage across capacitor C29 from the high voltage rectified DC supply voltage HVDC at the input node 12. A second sub-circuit 34 is formed by resistor R14, capacitor C5, zener diode D2 and diode D8, with this sub-circuit 34 generating the VCC voltage across capacitor C29 in response to a voltage generated by a secondary winding Ls of the transformer T1.

More details concerning the configuration and operation of the circuit of FIG. 2 may be obtained from the referenced data sheet for the L6562A/L6562AT integrated circuit.

The first sub-circuit 32 is provided to generate the VCC voltage during start-up of the PFC power conversion circuit 10. After start-up, the second sub-circuit 34 can be used to generate the VCC voltage. However, it is a concern that the first sub-circuit 32 will continue to dissipate power. Consider FIG. 3 which shows an equivalent simplified circuit representation of the circuit shown in FIG. 2. The first sub-circuit 32 with resistor R45 is the source of the undesired power dissipation. This power dissipation is not insignificant. Consider, for example, an AC input voltage of 525V. This will produce a rectified DC supply voltage HVDC at node 12 of 742 V=(525 V*1.414). If R45 is 800 kΩ (as an example), and the clamping voltage of the internal zener ZDint at the VCC supply node within the analog controller 18 integrated circuit chip is 18V, then the static current flowing in the first sub-circuit 32 is ΔV/R=(742V−18V)/800 kΩ=0.905 mA. The static power dissipation (loss), $I^2R$, with respect to the first sub-circuit 21 is then $(0.905 \text{ mA})^2 * 800 \text{ k}\Omega = 0.655$ W.

There is a need in the art to address the concern with static power loss.

SUMMARY

A novel scheme for reducing the static power losses operates to selectively disable the bias resistors or potential divider network after startup. The control circuit and switch off threshold is designed to ensure that startup voltage supply is disabled only when a stable operating voltage is available through alternate means (such as, for example, through the auxiliary winding).

In an embodiment, circuitry is provided for supplying a DC supply voltage to an integrated circuit chip having a power supply input terminal. The circuitry comprises: a first circuit coupled to receive an input voltage and selectively generate the DC supply voltage at the power supply input terminal; and a second circuit that controls the selective generation by the first circuit, said second circuit coupled to receive the input voltage and the DC supply voltage and configured to compare the DC supply voltage to a threshold and cause the first circuit to terminate selective generation if the DC supply voltage exceeds the threshold.

In an embodiment, circuitry is provided for supplying a DC supply voltage to an integrated circuit chip. The circuitry comprises: a first circuit including a first transistor switch, wherein said first circuit is coupled to receive an input voltage and configured to generate the DC supply voltage for the integrated circuit chip when the first transistor is turned ON; and a second circuit that controls turning ON and turning OFF of the first transistor switch, said second circuit configured to bias the first transistor switch to turn ON by default in response to the input voltage and further configured to switch the first transistor switch to turn OFF in response to the DC supply voltage exceeding a threshold.

DETAILED DESCRIPTION

Figure 4:
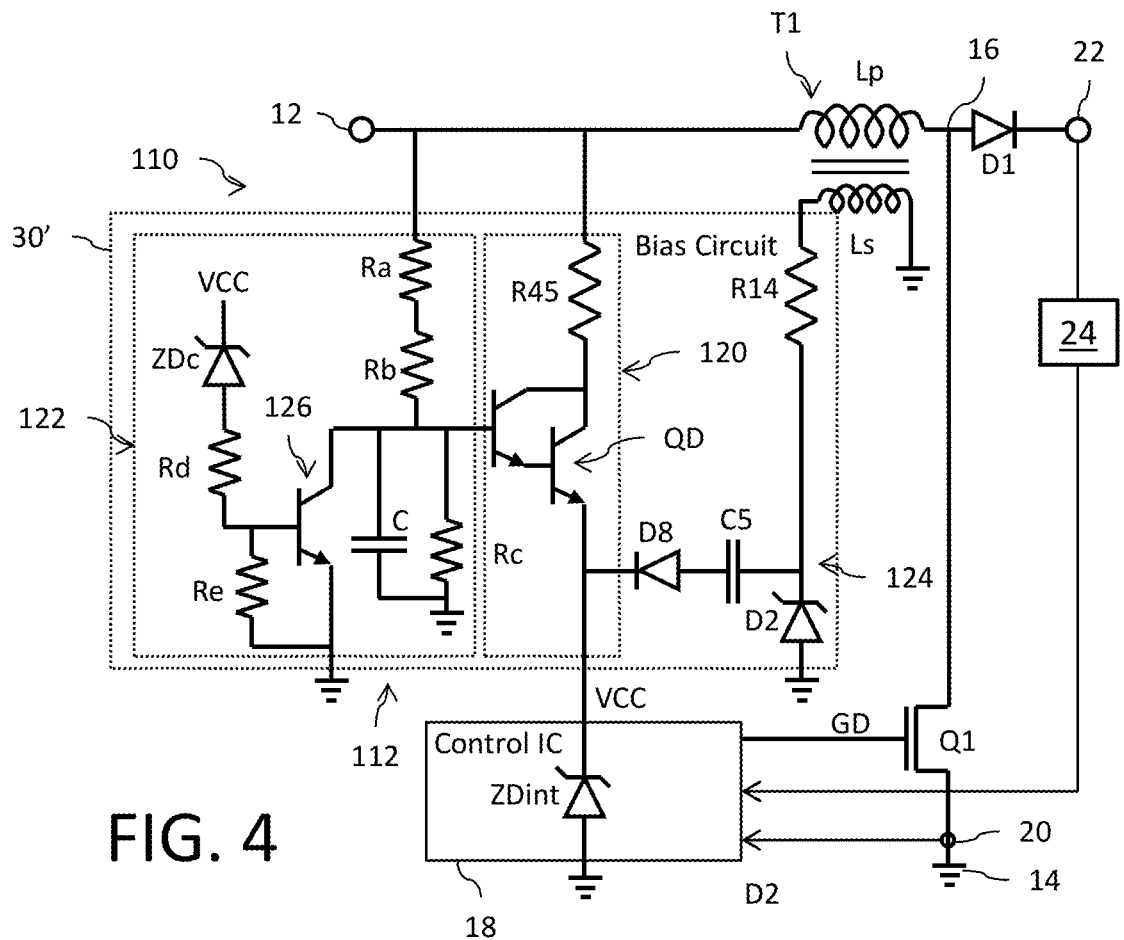
FIG. 4 shows a circuit diagram showing an equivalent simplified circuit representation of a power converter circuit which includes an embodiment of a static power consumption reduction circuit.

FIG. 4 shows a circuit diagram showing an equivalent simplified circuit representation of a power conversion circuit 110 (for example, for power factor correction (PFC)) which includes an embodiment of a static power consumption reduction circuit 112. The static power consumption reduction circuit 112 comprises two circuit sections. A first circuit section 120 is a sub-circuit of a bias circuit 30' which supplies the VCC voltage to analog controller 18 integrated circuit chip at startup. A second circuit section 122 is a control circuit which disables the bias resistors or potential/voltage divider network (reference R45) of the first circuit section 120 after startup and only when a stable operating voltage is available through an alternate means (such as, for example, through a sub-circuit 124 of the bias circuit 30' which generates the supply voltage VCC from the secondary (auxiliary) winding Ls of the transformer T1).

The first circuit section 120 includes resistor R45 connected in series with a controlled switching circuit (formed, for example, by a Darlington transistor QD and the high voltage rectified DC supply voltage HVDC), where the series-connected resistor R45 and collector-emitter path of the Darlington transistor QD are coupled between the high voltage rectified DC supply voltage HVDC and the ground reference. The collector (conduction) terminal of the Darlington transistor QD is connected to the resistor R45 and the emitter terminal of Darlington transistor QD is connected to the power supply input VCC of the analog controller 18 integrated circuit chip. A zener diode ZDint within the analog controller 18 integrated circuit chip is coupled between the power supply input VCC and the ground reference. The control terminal of the Darlington transistor QD is driven by the output of the second circuit section 122. In default or start-up mode of operation, the second circuit section 122 biases the Darlington transistor QD in an ON state to allow current to flow from input 12 through resistor R45. The first circuit section 120 accordingly generates the supply voltage (VCC) for the analog controller integrated circuit chip from the high voltage rectified DC supply voltage HVDC. Following completion of start-up, once a stable VCC is available from sub-circuit 124 of the bias circuit 30', the second circuit section 122 biases the Darlington transistor QD to switch into an OFF state which disconnects the current path from high voltage rectified DC supply voltage HVDC through resistor R45.

The second circuit section 122 includes a first circuit network including resistors Ra and Rb connected in series between the high voltage rectified DC supply voltage HVDC and the control terminal of the Darlington transistor QD. The first circuit network also includes resistor Rc and capacitor C which are connected in parallel with each other between the control terminal of the Darlington transistor QD and ground. This first circuit network of the second circuit section 122 provides a small magnitude current to the control terminal (BASE) of the Darlington transistor QD to bias the Darlington transistor QD in the ON state by default. The second circuit section 122 further includes a second circuit network including a control transistor 126 (for example, an NPN bipolar transistor) having a collector terminal connected to the control terminal of the Darlington transistor QD and an emitter terminal connected to ground. The control terminal of the transistor 126 is connected to receive the supply voltage (VCC) for the analog controller integrated circuit chip through a further part of the second circuit network including a series connection of a zener diode ZDc and resistor Rd. The second circuit network further includes a resistor Re that connects the control terminal of the NPN transistor to ground. This second circuit network of the second circuit section 122 functions as a control circuit that is sensitive to the supply voltage VCC and operable to turn on transistor 126 when the level of the supply voltage VCC exceeds a certain threshold voltage. When the transistor 126 turns on, the control terminal of the Darlington transistor QD in grounded and the Darlington transistor QD is forced into the OFF state.

Figure 1A:
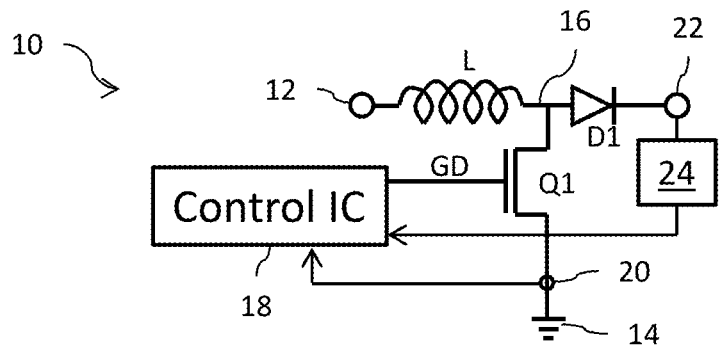
FIG. 1A is a basic circuit diagram for a power converter circuit.
Figure 1B:
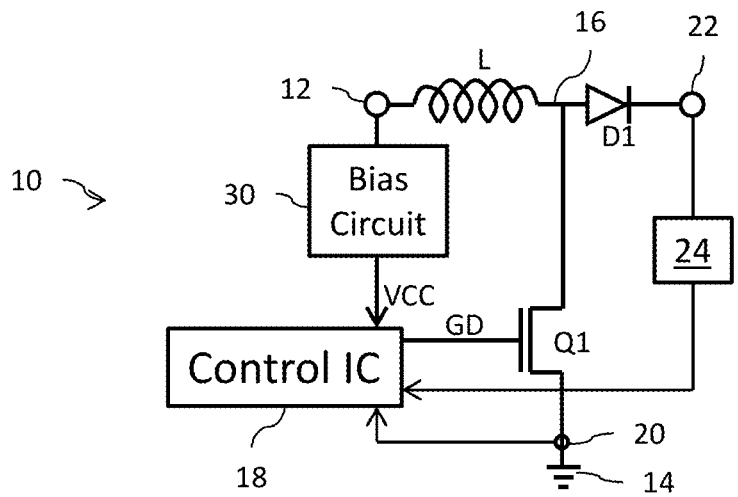
FIG. 1B is a basic circuit diagram for a power converter circuit.
Figure 1C:
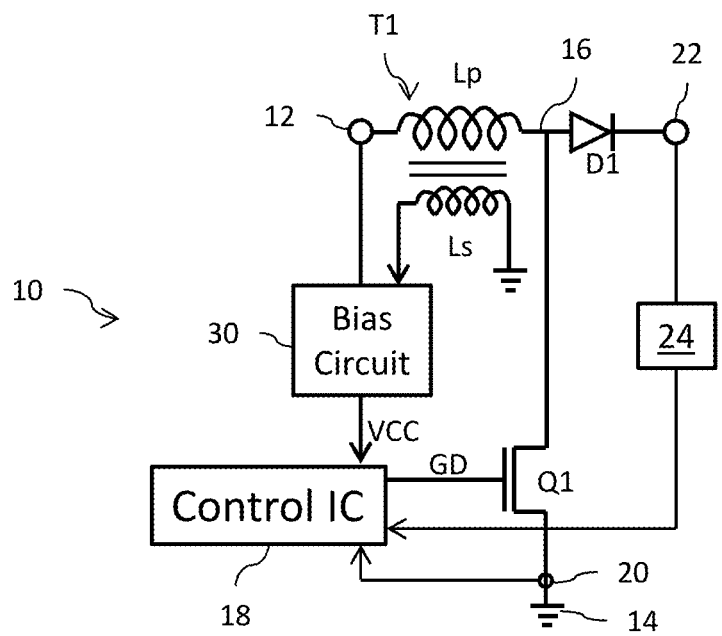
FIG. 1C is a basic circuit diagram for a power converter circuit.
Figure 2:
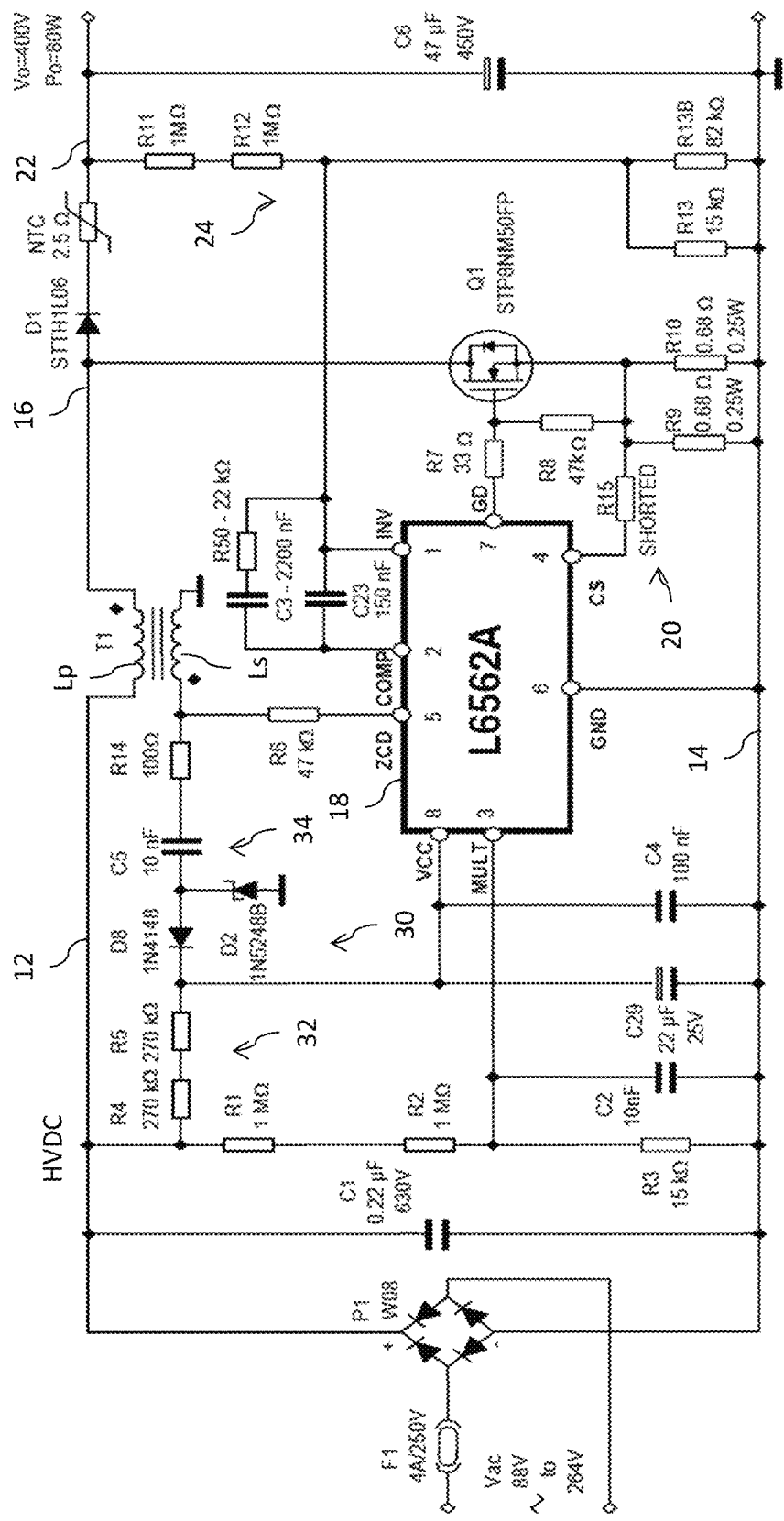
FIG. 2 is a circuit diagram for a practical example of the power converter circuit as shown in FIG. 1C.
Figure 3:
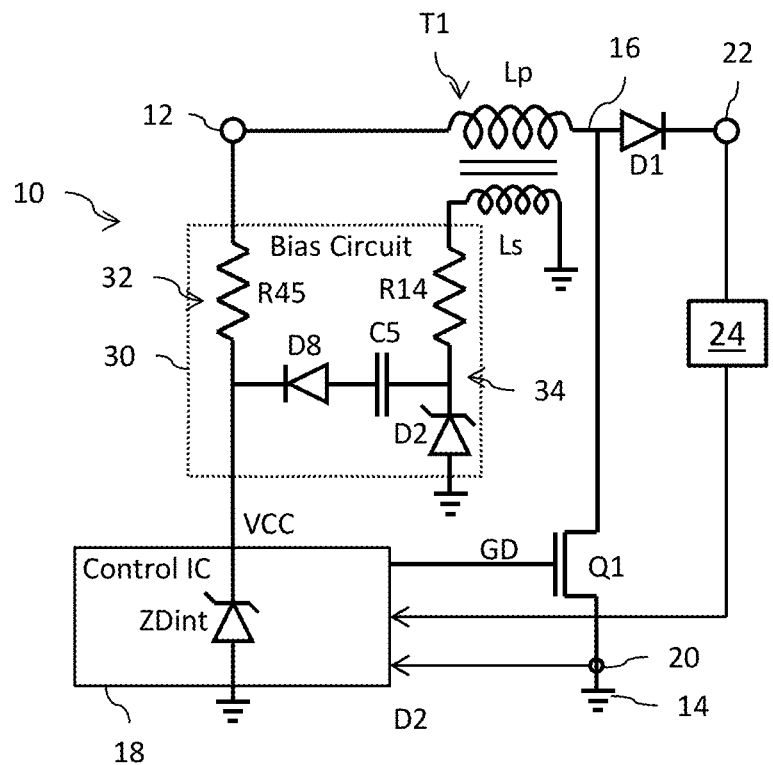
FIG. 3 is a circuit diagram showing an equivalent simplified circuit representation of the circuit of FIG. 2.

The sub-circuit 124 of the bias circuit 30' is equivalent to the circuit 34 shown in FIG. 3.

In an operating condition where the supply voltage (VCC) for the analog controller integrated circuit chip does not exceed a threshold voltage level set by the zener diode ZDc (for example, during the start-up operation), the output of the second circuit section 122 permits the Darlington transistor QD to be biased in the ON state by default. However, when the level of the supply voltage (VCC) for the analog controller integrated circuit chip rises to exceed the threshold voltage level, the output of the second circuit section 122 causes the Darlington transistor QD to be switched to the OFF state. When Darlington transistor QD is turned off, the static current discharge path from the input node 12 through resistor R45 and Darlington transistor QD is severed.

The Darlington transistor QD may, for example, comprise an STP03D200 device.

The control transistor 126 may, for example, comprise a 2STR1160 device.

The Darlington transistor QD is operated as a switch coupled in series with the bias resistors or potential divider network (resistor R45) and is biased by the second circuit section 122 in the ON state by default. The high amplification factor of Darlington transistor QD allows for controlling its operation at a significantly lower bias current at the control (BASE) terminal. Therefore, the bias current provided by second circuit section 122 that is required to turn ON the Darlington transistor switch can be set several times lower than the current flowing through its collector terminal to supply the VCC voltage to the analog controller. This is accomplished by providing both resistor Ra and resistor Rb with very high resistance values (such as in excess of a few Megaohms each).

On powering up the system, since the Darlington transistor switch is biased in the ON state by default, the supply voltage VCC to the analog controller 18 rises due to current flowing through the bias resistors or the potential divider network (R45). Once the supply voltage VCC reaches a minimum operating voltage threshold, the converter switching action starts with the analog controller integrated circuit chip generating the gate drive (GD) signal for controlling switching operation of the power transistor Q1. As a result of this switching operation, the auxiliary winding of the transformer T1 will also start to generate a voltage which is provided through the sub-circuit 124 to generate the supply voltage VCC of the analog controller.

The second circuit section 122 uses a unique circuit configuration (with resistors Rd, Re, transistor 126 and zener diode ZDc) to ensure that the Darlington transistor switch is turned OFF only when the supply voltage VCC being generated through the auxiliary winding and circuit 124 is in excess of the certain threshold voltage, which is set by the second circuit section 122 at a level that is sufficiently higher than the minimum operating voltage threshold of the analog controller 18 integrated circuit to ensure that switched mode operation has begun. This threshold for permitting turn OFF of the Darlington transistor switch is easily modifiable through component value selection to adapt the circuit to different minimum operating voltage threshold requirements of any analog controller.

Figure 5:
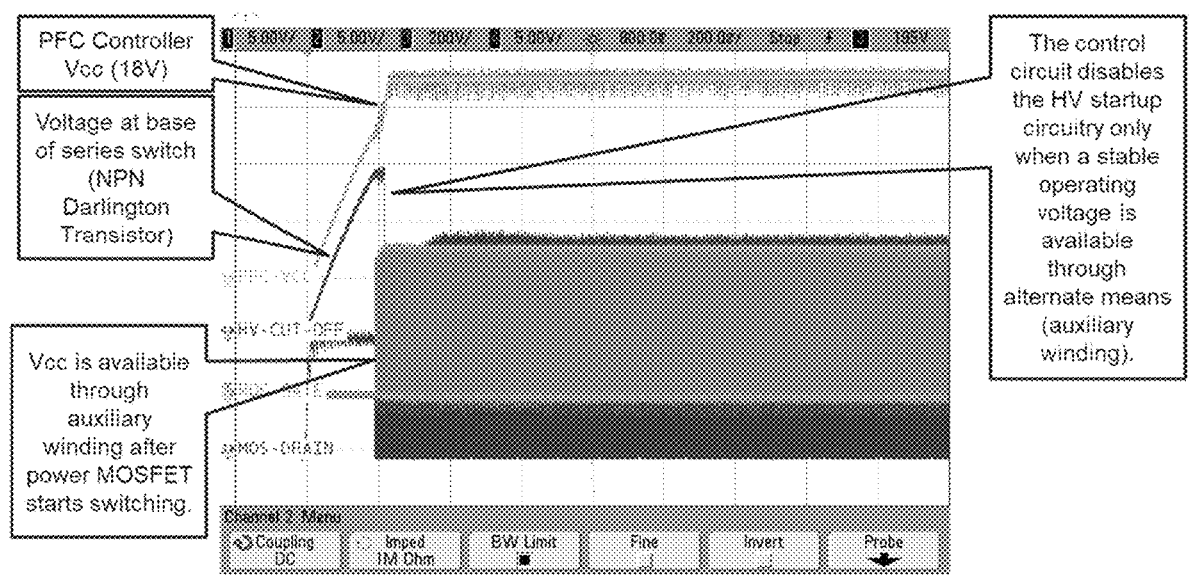
FIG. 5 shows operating waveforms for the circuit of FIG. 4.

FIG. 5 shows operating waveforms for the circuit of FIG. 4. It can be seen from FIG. 5 that the control circuit turns OFF the HV (High Voltage) startup circuitry through resistor R45 after a stable power supply voltage VCC level is available from the auxiliary (secondary) winding Ls of transformer T1.

The implemented scheme of FIG. 4 has a significantly lower static power loss as compared to the solution of FIG. 3. Although the power dissipation through first circuit section 120 is eliminated when the control circuit turns OFF the Darlington transistor switch, it will be noted that there will be some static power dissipation associated with the continuing operation of the second circuit section 122. There are two components this loss: a) a first component due to loss associated with the operation of the first circuit network (resistors Ra, Rb, Rc and capacitor C) which corresponds to the power dissipated in the bias resistors required to turn ON the Darlington switch during startup; and b) a second component due to loss associated with the operation of the second circuit network (resistors Rd, Re, zener diode ZDc and the control transistor 126) which corresponds to the power dissipated in the control circuit (Zener+low voltage transistor section) used to turn off the Darlington switch.

Consider, for example, an AC input voltage of 525V. This will produce a rectified DC supply voltage HVDC of 742 V (525 V*1.414). If Ra and Rb are each 3 MΩ and Rc is 470 kΩ, then the static current flowing is ΔV/R=(742V-0V)/600 kΩ=0.124 mA. Note: the resistor Rc does not come into play for calculating static power loss because it is by-passed by transistor 126. The power loss, I$^2$R, for the first circuit network (of the second control circuit 122) is then (0.124 mA)$^2$*6000 kΩ=0.092 W. Now, if the zener diode ZDc is a 15V device and Rd is 2.21KΩ, then the current associated with biasing the operation of the transistor 126 is a function of the voltage VCC and the base-to-emitter voltage of the transistor 126:

$$I = \frac{(VCC - 15 - Vbe)}{R}$$

$$I = \frac{(18 - 15 - 0.3)}{2.2K}$$

So that the current I=1.22 mA. The power loss, I$^2$R, for the second circuit network (of the second control circuit 122) is then (1.2 mA)$^2$*2.2 kΩ=0.003 W and the power dissipated across the zener diode ZDc is 15*1.22 mA=0.0183 W. This gives a total static power loss of 0.1133 W for the second control circuit 122, which is 5.78 times less than the 0.655 W loss of the FIG. 3 circuit, with an improvement in static power dissipation of 82.7%.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. Circuitry for supplying a DC supply voltage to an integrated circuit chip having a power supply input terminal, wherein the integrated circuit chip controls operation of a switched mode power conversion circuit, comprising:
a first circuit coupled to receive an input voltage and selectively generate the DC supply voltage at the power supply input terminal; and
a second circuit that controls the selective generation by the first circuit, said second circuit coupled to receive the input voltage and the DC supply voltage and configured to compare the DC supply voltage to a threshold and cause the first circuit to terminate selective generation if the DC supply voltage exceeds the threshold; and
wherein the threshold is higher than a minimum operating voltage threshold of the integrated circuit chip for controlling operation of the switched mode power conversion circuit.

2. The circuitry of claim 1, wherein said first circuit has a first static power dissipation level when generating the DC supply voltage and wherein said second circuit has a second static power dissipation level that is less than the first static power dissipation level.

3. The circuitry of claim 1, wherein the switched mode power conversion circuit includes a first inductor coupled in series with a power transistor between an input node receiving the input voltage and a reference node, said integrated circuit chip configured to control switched mode operation of the power transistor.

4. The circuitry of claim 3, further comprising a second inductor coupled to the first inductor, said second inductor configured to generate a further voltage in response to switched mode operation, and further including a third circuit coupled to receive the further voltage and generate the DC supply voltage at the power supply input terminal.

5. The circuitry of claim 4, wherein the first and second inductors form a transformer.

6. Circuitry for supplying a DC supply voltage to an integrated circuit chip having a power supply input terminal, comprising:
a first circuit coupled to receive an input voltage and selectively generate the DC supply voltage at the power supply input terminal; and
a second circuit that controls the selective generation by the first circuit, said second circuit coupled to receive the input voltage and the DC supply voltage and configured to compare the DC supply voltage to a threshold and cause the first circuit to terminate selective generation if the DC supply voltage exceeds the threshold;
wherein the first circuit comprises:
a first resistor; and
a transistor switch;
wherein the first resistor and transistor switch are coupled in series between an input node receiving the input voltage and the power supply input terminal.

7. The circuitry of claim 6, wherein the transistor switch is a Darlington transistor.

8. The circuitry of claim 6, wherein the second circuit controls the transistor switch to be in an ON state when the DC supply voltage is less than the threshold and further controls the transistor switch to be in an OFF state when the DC supply voltage is greater than the threshold.

9. The circuit of claim 8, wherein the second circuit includes a bias circuit configured to bias the transistor switch in the ON state.

10. The circuit of claim 8, wherein the second circuit includes a control circuit configured to bias the transistor switch in the OFF state when the DC supply voltage is greater than the threshold.

11. The circuitry of claim 6, wherein said first circuit has a first static power dissipation level when generating the DC supply voltage and wherein said second circuit has a second static power dissipation level that is less than the first static power dissipation level.

12. Circuitry for supplying a DC supply voltage to an integrated circuit chip, wherein the integrated circuit chip controls operation of a switched mode power conversion circuit, comprising:
a first circuit including a first transistor switch, wherein said first circuit is coupled to receive an input voltage and configured to generate the DC supply voltage for the integrated circuit chip when the first transistor is turned ON; and
a second circuit that controls turning ON and turning OFF of the first transistor switch, said second circuit configured to bias the first transistor switch to turn ON by default in response to the input voltage and further configured to switch the first transistor switch to turn OFF in response to the DC supply voltage exceeding a threshold; and
wherein the threshold is higher than a minimum operating voltage threshold of the integrated circuit chip for controlling operation of the switched mode power conversion circuit.

13. The circuitry of claim 12, wherein the second circuit comprises a resistance coupled between an input node receiving the input voltage and a control terminal of the first transistor switch.

14. The circuitry of claim 13, wherein the second circuit comprises a second transistor switch coupled between the control terminal of the first transistor switch and a reference node and configured to be selectively turned ON when the DC supply voltage exceeds the threshold in order to turn OFF the first transistor switch.

15. The circuitry of claim 12, wherein said first circuit has a first static power dissipation level when the first transistor switch is turned ON and wherein said second circuit has a second static power dissipation level that is less than the first static power dissipation level.

16. The circuitry of claim 12, wherein the switched mode power conversion circuit includes a first inductor coupled in series with a power transistor between an input node receiving the input voltage and a reference node, said integrated circuit chip configured to control switched mode operation of the power transistor.

17. The circuitry of claim 16, further comprising a second inductor coupled to the first inductor, said second inductor configured to generate a further voltage in response to switched mode operation, and further including a third circuit coupled to receive the further voltage and generate the DC supply voltage.

18. The circuitry of claim 17, wherein the first and second inductors form a transformer.

19. The circuitry of claim 12, wherein the first transistor switch is a Darlington transistor.

20. The circuitry of claim 12, wherein the first circuit comprises a resistance coupled in series between an input node receiving the input voltage and a conduction terminal of the first transistor switch.

21. Circuitry, comprising:
a power conversion circuit including a first transistor switch having a control terminal configured to receive a switching control signal, said power conversion circuit receiving an input voltage and generating an output voltage in response to said switching control signal;
an integrated circuit chip having a power supply input configured to receive a DC supply voltage, said integrated circuit configured to generate said switching control signal if said DC supply voltage exceeds a first threshold;
a second transistor switch with a conduction path coupled between the input voltage and the power supply input;
a first biasing circuit configured to bias the second transistor switch in an on state as a default operation; and
a second biasing circuit configured to bias the second transistor switch in an off state if said DC supply voltage exceeds a second threshold that is greater than the first threshold.

22. The circuitry of claim 21, wherein the second transistor switch is a Darlington transistor.

23. The circuitry of claim 21, further including a resistor connected in series with the second transistor switch between the input voltage and the power supply input.

24. The circuit of claim 21, wherein the first biasing circuit comprises a resistor circuit coupled in series between the input voltage and a control terminal of the second transistor switch.

25. The circuit of claim 21, wherein the second biasing circuit comprises:
a voltage circuit configured to determine whether said DC supply voltage exceeds the second threshold and generate a control signal; and
a third transistor switch actuated by said control signal to turn on the second transistor switch.

26. The circuit of claim 25, wherein said second threshold is set by zener diode.

27. The circuit of claim 21, wherein said power conversion circuit further includes an inductor connected in series with the first transistor switch between the input voltage and a reference voltage.

28. The circuit of claim 27, wherein said inductor is a transformer having a primary winding and secondary winding, and wherein said primary winding is connected in series with the first transistor switch between the input voltage and a reference voltage.

29. The circuit of claim 28, further comprising a supply voltage generating circuit connected to the secondary winding and configured to generate said DC supply voltage.

* * * * *